United States Patent
Sabouri

(10) Patent No.: US 6,774,723 B2
(45) Date of Patent: Aug. 10, 2004

(54) OUTPUT STAGE WITH STABLE QUIESCENT CURRENT

(75) Inventor: Faramarz Sabouri, Lawrenceville, NJ (US)

(73) Assignee: Analog Devices, Inc., Norwood, MA (US)

( * ) Notice: Subject to any disclaimer, the term of this patent is extended or adjusted under 35 U.S.C. 154(b) by 12 days.

(21) Appl. No.: 10/176,023

(22) Filed: Jun. 20, 2002

(65) Prior Publication Data

US 2003/0141930 A1 Jul. 31, 2003

Related U.S. Application Data

(60) Provisional application No. 60/351,803, filed on Jan. 25, 2002.

(51) Int. Cl.[7] ................................................ H03F 3/26
(52) U.S. Cl. ...................................... 330/288; 330/267
(58) Field of Search ................................ 330/263, 267, 330/288; 323/315, 316

(56) References Cited

U.S. PATENT DOCUMENTS

| | | | |
|---|---|---|---|
| 4,570,128 A | 2/1986 | Monticelli | 330/267 |
| 5,786,731 A | 7/1998 | Bales | 330/267 |
| 5,804,994 A | 9/1998 | Marlow et al. | 327/67 |
| 6,104,244 A | 8/2000 | Gilbert | 330/267 |
| 6,362,686 B1 * | 3/2002 | Escobar-Bowser | 330/267 X |
| 2002/0060607 A1 | 5/2002 | Forejt | 330/253 |

FOREIGN PATENT DOCUMENTS

EP  0 797 295  9/1997  ............. H03F/3/30

OTHER PUBLICATIONS

Iomazou, C. et al., "Anaolgue IC design: the current–mode approach", On Behalf of The IEE pp. 21–22, 1993.
Surakampontorn, W. et al., "Dual translinear sinusoidal frequency doubler and full–wave rectifier", Int. J. Electronics, vol. 65, No. 6, Dec. 1, 1998, pp. 1203–1208.

* cited by examiner

Primary Examiner—Steven J. Mottola
(74) Attorney, Agent, or Firm—Bromberg & Sunstein LLP

(57) ABSTRACT

A circuit for matching a first mirror transistor with a second mirror transistor in a current mirror includes a bias transistor and a diode connected transistor to match such mirror transistors. More particularly, the circuit is a part of an amplifier having an output with a quiescent voltage and at least one rail voltage. The first mirror transistor has a first terminal coupled to the output and a second terminal coupled to the at least one rail voltage. To effectuate its mirroring function, the bias transistor is coupled to a first terminal of the second mirror transistor, and the diode connected transistor is coupled to both a second terminal of the second mirror transistor and the at least one rail voltage. The bias transistor has a terminal with a quiescent voltage that is substantially equal to the quiescent voltage of the output.

20 Claims, 2 Drawing Sheets

OUTPUT STAGE WITH STABLE QUIESCENT CURRENT

PRIORITY

This U.S. patent application claims priority from U.S. provisional patent application No. 60/351,803, filed on Jan. 25, 2002.

FIELD OF THE INVENTION

The invention generally relates to electronic amplifiers and, more particularly, the invention relates to a circuit for reducing the sensitivity of an output stage due to environmental and/or fabrication process effects.

BACKGROUND OF THE INVENTION

Power amplifiers are used to drive heavy loads in a wide variety of applications. Many such applications use output stages, such as class-AB output stages, to achieve high linearity and efficiency. A number of factors affect the performance of the output stage. Among others, the quiescent current (i.e., no AC signal) of the output stage affects performance of the amplifier primarily through crossover distortion, power dissipation, and stability. To ensure reliable operation, the quiescent current of the output stage should be independent of supply, temperature, and process variations.

Many prior art output stages, however, are sensitive to such process variations. For example, many output stages are designed to operate at a very low power, thus requiring very small currents. Accordingly, a small variation in the quiescent current can adversely affect the overall performance of the power amplifier. It thus is important for the quiescent current in the output stage to be constant and thus, relatively independent of external factors, such as those noted above.

SUMMARY OF THE INVENTION

In accordance with one aspect of the invention, a circuit for matching a first mirror transistor with a second mirror transistor in a current mirror includes a bias transistor and a diode connected transistor to match such mirror transistors. More particularly, the circuit is a part of an amplifier having an output with a quiescent voltage and at least one rail voltage. The first mirror transistor has a first terminal coupled to the output, and a second terminal coupled to the at least one rail voltage. To effectuate its mirroring function, the bias transistor is coupled to a first terminal of the second mirror transistor, and the diode connected transistor is coupled to both a second terminal of the second mirror transistor and the at least one rail voltage. The bias transistor has a terminal with a quiescent voltage that is substantially equal to the quiescent voltage of the output.

In illustrative embodiments, the transistors are one of field effect transistors and bipolar junction transistors. If bipolar junction transistors, the transistors may be at least one of NPN bipolar junction transistors and PNP bipolar junction transistors. Also if bipolar junction transistors, the bias transistor and the diode connected transistor at least in part cause the first and second mirror transistors to have substantially equal collector-emitter quiescent voltages.

The first mirror transistor may be an output transistor. Moreover, the terminal of the bias transistor (i.e., the terminal having a quiescent voltage that is substantially equal to the quiescent voltage of the output) illustratively is not coupled with the output.

In accordance with another aspect of the invention, a circuit for matching a first mirror transistor with a second mirror transistor in a current mirror includes a first bias transistor and a second bias transistor to provide proper mirroring. More specifically, the first mirror transistor is a diode connected transistor, and the first bias transistor is coupled with a first terminal of the second mirror transistor. The second bias transistor is coupled with a second terminal of the second mirror transistor. The second bias transistor also is a diode connected transistor. The first bias transistor, second bias transistor, and second mirror transistor form a voltage loop in which the sum of the voltages in the loop equals zero.

In a manner similar to other aspects of the invention, the transistors are one of field effect transistors and bipolar junction transistors. If bipolar junction transistors, the transistors may be at least one of NPN bipolar junction transistors and PNP bipolar junction transistors. Also if bipolar junction transistors, the first and second bias transistors at least in part cause the first and second mirror transistors to have substantially equal collector-emitter quiescent voltages. Additionally, the first bias transistor may have a base node, and the second bias transistor also may have a base node. The base nodes of the two bias transistors are coupled at the same potential.

In accordance with other aspects of the invention, an amplifier (having an output with a quiescent voltage and at least one rail voltage) has an output transistor that receives a controlled current from a mirroring arrangement. To that end, the output transistor has a first terminal coupled with the output and a second terminal coupled with the at least one rail voltage. The amplifier also includes a first bias transistor forming a mirror with the output transistor, a second bias transistor coupled to a first terminal of the first bias transistor and having a terminal with a quiescent voltage that is substantially equal to the quiescent voltage of the output, and a third bias transistor coupled to both a second terminal of the first bias transistor and the at least one rail voltage. The third bias transistor illustratively is a diode connected transistor. The amplifier also includes a mirror transistor that forms a mirror with the third bias transistor, a fourth bias transistor coupled with a first terminal of the mirror transistor, and a fifth bias transistor coupled with a second terminal of the mirror transistor. The fifth bias transistor is a diode connected transistor, and the fourth bias transistor, fifth bias transistor, and mirror transistor form a voltage loop in which the sum of the voltages in the loop equals zero.

In a manner similar to other aspects of the invention, the transistors can be one of field effect transistors and different types of bipolar junction transistors. Additionally, the output transistor may be a portion of an A-B output stage. The second bias transistor illustratively is doped in an opposite manner to the doping of the first bias transistor. For example, in this embodiment, if the first bias transistor is an NPN bipolar junction transistor, then the second bias transistor is a PNP bipolar junction transistor.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, an output transistor in an amplifier is biased to be less sensitive to certain variables, such as process, temperature, and supply variations. More specifically, as known by those skilled in the art, quiescent currents (i.e., when no AC signal is present) often are set to be small to save power. Consequently, small fluctuations in quiescent current due to the above noted variables can adversely affect amplifier performance. To minimize such effects, embodiments of the invention maintain the stability of the quiescent current through the output stage under relatively extreme conditions. As a result, the quiescent currents of the amplifier can be set marginally small.

Figure 1:
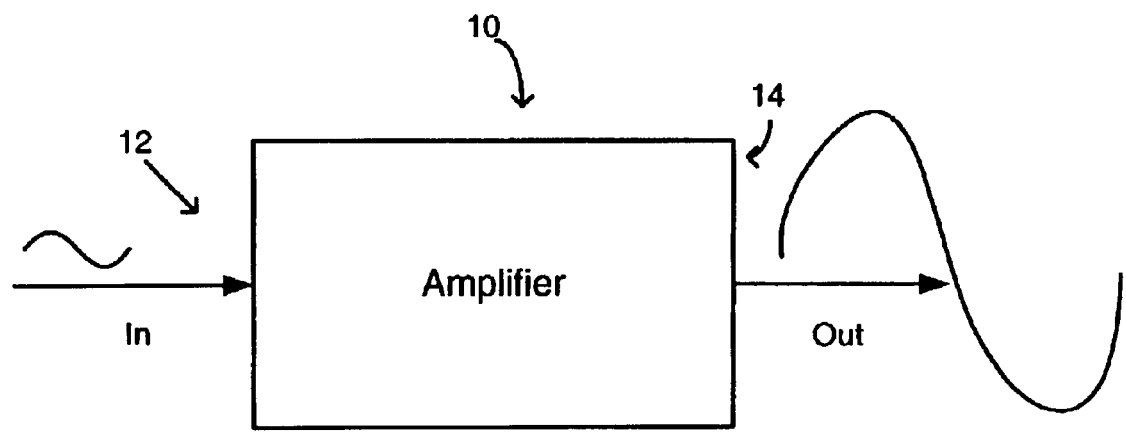
FIG. 1 schematically shows an amplifier that may be configured in accordance with illustrative embodiments of the invention.

FIG. 1 schematically shows a power amplifier ("amplifier 10") configured in accordance with illustrative embodiments of the invention. The amplifier 10 may be one used to drive heavy loads in a plurality of applications. For example, the amplifier 10 may be a class-AB amplifier that is a part of a line driver. As shown in FIG. 1, the amplifier 10 includes an input 12 for receiving an input signal to be amplified, amplification hardware (see FIG. 2) to amplify the input signal, and an output 14 to deliver the amplified signal. In illustrative embodiments, the input signal is an AC signal.

It should be noted that discussion of a specific type of amplifier is exemplary and thus, not intended to limit the scope of the invention. Accordingly, other types of amplifiers may be configured to implement various embodiments of the invention.

Figure 2:
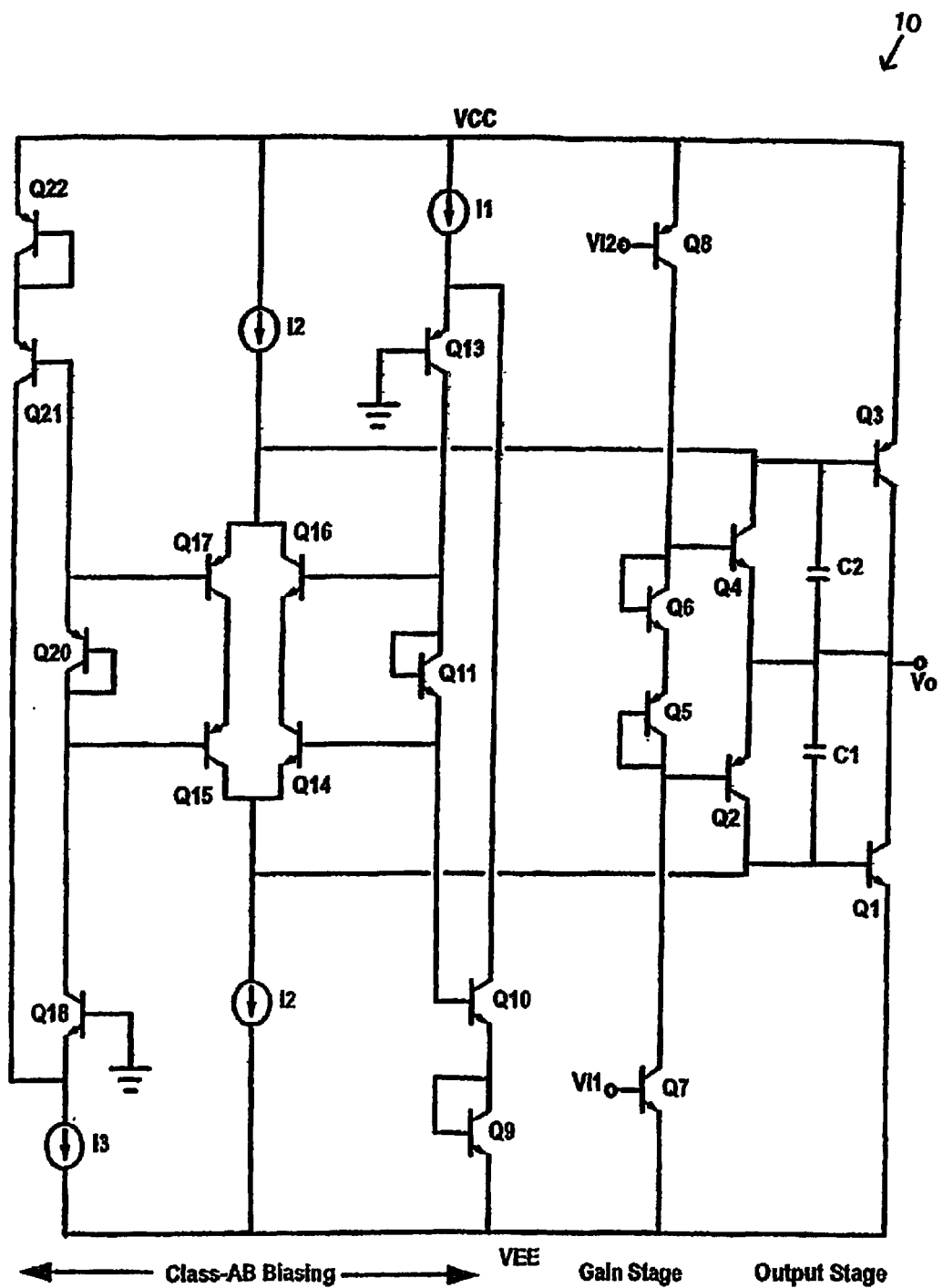
FIG. 2 schematically shows additional details of the amplifier shown in FIG. 1.

FIG. 2 schematically shows additional details of the relevant circuitry within the amplifier 10. Specifically, the amplifier 10 has three principle stages; namely a gain stage, an output stage, and a biasing stage. Each of these stages is discussed in detail below. In addition, the amplifier 10 is energized by a high rail voltage (Vcc) and a low rail voltage (Vee). In illustrative embodiments, the high rail voltage Vcc, is set to 12 volts, while the low rail voltage is set to −12 volts. Of course, the rail voltages can be set to different voltages as required by the application.

The gain stage includes first and second differential inputs VI1 and VI2 to respective first and second gain transistors Q7 and Q8. The first gain transistor Q7 is an NPN bipolar junction transistor, while the second gain transistor Q8 is a PNP bipolar junction transistor. Although the gain stage is configured to receive a differential input, various embodiments can be implemented with a single input. Embodiments of the invention thus are not intended to be limited to a differential input device. Moreover, in illustrative embodiments, the gain stage is a high voltage common emitter gain stage.

The gain stage also includes a pair of diode connected transistors Q5 and Q6 that couple with components of the output stage. In illustrative embodiments, the output stage is configured to drive loads considered to be heavy by those in the art. To that end, the output stage is a unity-voltage-gain pseudo Darlington having output transistors Q1, Q2, Q3, and Q4, and a pair of capacitors C1 and C2 for compensation. The output voltage of the amplifier 10 is delivered to the output Vo, which is driven by the output transistors Q1 and Q3. If the high rail voltage Vcc is 12 volts, and the low rail voltage Vee is −12 volts, then the quiescent voltage of the output Vo can be at zero volts. Also as shown in FIG. 2, the output transistors Q1 and Q4 are NPN bipolar junction transistors, while the output transistors Q2 and Q3 are PNP bipolar junction transistors.

In accordance with illustrative embodiments of the invention, the bias stage is configured to ensure that the output transistors Q1 and Q3 receive a stable quiescent current. To that end, the amplifier 10 includes various transistors that act as mirror pairs. As can be deduced by inspection of FIG. 2, these transistors form respective translinear loops. Specifically, the output stage has a first mirror transistor Q10 that mirrors output transistor Q1, and a second mirror transistor Q9 that mirrors a third mirror transistor Q14. These transistors Q1, Q9, Q10, and Q14 form a first translinear loop. Moreover, like the output transistor Q1, the first, second and third mirror transistors Q10, Q9, and Q14 all are NPN bipolar junction transistors. It should be noted that the amplifier 10 has a second translinear loop for biasing the output transistor Q3—namely a translinear loop of PNP bipolar junction transistors. Details of this translinear loop are not discussed, however, since discussion of the first translinear loop should enable those skilled in the art to understand its operation.

The output transistor Q1 and first mirror transistor Q10 are considered to form a first mirror pair, while the second and third mirror transistors Q9 and Q14 are considered to form a second mirror pair. Each transistor in the respective mirror pairs preferably is biased by other transistors in the bias stage to have substantially equal collector-emitter voltages. More specifically, output transistor Q1 and first mirror transistor Q10 are biased to have substantially equal quiescent collector-emitter voltages. In a similar manner, second mirror transistor Q9 and third mirror transistor Q14 also are biased to have substantially equal quiescent collector-emitter voltages. The two mirror pairs now will be discussed.

The First Mirror Pair Q1 and Q10

The first mirror pair uses a first bias transistor Q13 and the second mirror transistor Q9 to match quiescent collector-emitter voltages. To that end, the base of the first bias transistor Q13 is set to have a quiescent voltage that is substantially equal to the quiescent voltage of the output Vo. In the example discussed above, the output quiescent voltage is zero. Accordingly, the base of the first bias transistor Q13 is set to ground. If the output voltage were not zero, then the base voltage of the bias transistor Q13 would be modified to have the same voltage. It should be noted that in illustrative embodiments, the output Vo is not coupled with the base of the first bias transistor Q13.

The emitter of the first mirror transistor Q10 is coupled with the collector of the second mirror transistor Q9. Because the base and collector of the second mirror transistor Q9 are shorted, the emitter of the first mirror transistor Q10 also is shorted to the base of the second mirror transistor Q9. Note that a bipolar junction transistor is considered to be a "diode connected transistor" when its collector and base are coupled. The transistor performs the function of a diode when such nodes are coupled. Those skilled in the art thus would consider a diode to be equivalent to a diode connected transistor.

Using the values discussed above, it now will be shown that the quiescent collector-emitter voltage across the output transistor Q1 is equal to the quiescent collector-emitter voltage across the first mirror transistor Q10. The voltages discussed are quiescent voltages. Starting with the output transistor Q1, it is clear that its collector node has a voltage equal to the quiescent output voltage (i.e., 0 volts) at output Vo, while its emitter node has a voltage equal to the low rail voltage Vee (i.e., −12 volts). Accordingly, the collector-emitter voltage of the output transistor Q1 is (0 volts)−(−12 volts), or 12 volts.

The collector-emitter voltage of the first mirror transistor Q10 now will be analyzed. First, the voltage of the collector node will be determined by following it to ground through the first bias transistor Q13. The voltage of the collector node thus equals 0.7 volts (assuming the absolute value of the ideal voltage drop of the base emitter junction of all bipolar junction transistors is 0.7 volts)+zero volts (i.e., ground). The voltage of this node thus equals 0.7 volts.

Next, the voltage in the emitter node of the first mirror transistor Q10 will be determined by following it to the low rail voltage Vee. Specifically, the voltage equals 0.7 volts (i.e., the voltage drop across the second mirror transistor Q9) plus−12 volts (i.e., the low rail voltage Vee). The emitter node of the first mirror transistor thus has a voltage of −11.3 volts. Consequently, the collector-emitter voltage of the first mirror transistor equals (0.7 volts)−(−11.3 volts), which equals 12 volts. As noted above, this is equal to the collector-emitter voltage of the output transistor Q1. The emitter areas of the respective mirrored transistors Q1 and Q10 thus may be selected to set the quiescent currents through such transistors.

The Second Mirror Pair Q9 and Q14

The second mirror pair uses a second bias transistor Q11 and a third bias transistor Q16 to match the collector-emitter voltage of the third mirror transistor Q14 to that of the second mirror transistor Q9. As clearly shown in FIG. 2, the quiescent collector-emitter voltage of the second mirror transistor Q9 is 0.7 volts because it is a diode connected transistor. The quiescent collector-emitter voltage of the third mirror transistor Q14 thus is 0.7 volts.

To that end, the second bias transistor Q11 is a diode connected transistor having its collector/base node coupled with the base of the third bias transistor Q16, and its emitter coupled with the base of the third mirror transistor Q14. The third bias transistor Q16 has its emitter coupled with the collector of the third mirror transistor Q14, and its emitter coupled with a current source and another bias transistor Q17. The transistors Q16, Q11, and Q14 together form a loop in which the voltages in the loop equal zero.

Using the values discussed above, it now will be shown that the quiescent collector-emitter voltage across the third mirror transistor Q14 is 0.7 volts (i.e., the collector-emitter voltage across the second mirror transistor Q9). As discussed above with regard to the first mirror pair, the voltages discussed are quiescent voltages.

Beginning from the base of the third mirror transistor Q14, the sum of the voltages across that loop equals zero. Specifically, the emitter-collector voltage of the second bias transistor Q11 is −0.7 volts, while the base-emitter voltage across the third bias transistor Q16 is 0.7 volts. The remaining voltage in the loop thus is the collector-base voltage of the third mirror transistor Q14. Since the 0.7 volts and −0.7 volts cancel out, the collector-base voltage of the third mirror transistor Q14 is zero, thus providing the function of a diode connected transistor. It thus follows that because the base-emitter voltage of the third mirror transistor Q14 is 0.7 volts, then the collector-emitter voltage of the third mirror transistor also is 0.7 volts. This matches the collector-emitter voltage of the second mirror transistor Q9.

In a manner similar to the output transistor Q1 and as noted above, the output transistor Q3 forms a second translinear loop with three other PNP bipolar junction transistors that perform the same function as was executed for the output transistor Q1. Accordingly, two additional PNP bipolar junction transistor mirror pairs are formed to perform the same function. Specifically, the output transistor Q3 and bias transistor Q21 form a first mirror pair, while bias transistors Q17 and Q22 form a second mirror pair. Those skilled in the art should be able to ascertain the appropriate relationships of these PNP pairs based upon the discussion above with regard to the NPN pairs.

In alternative embodiments, the amplifier 10 can be implemented in a variety of other technologies, such as with field effect transistors. When using field effect transistors, each NPN bipolar junction transistor is replaced with an N-channel MOSFET, while each PNP bipolar junction transistor is replaced with a P-channel MOSFET. Those skilled in the art can substitute other technologies other than field effect transistors.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

I claim:

1. A circuit for matching a first mirror transistor with a second mirror transistor in a current mirror, the circuit being a part of an amplifier having an output with a quiescent voltage and at least one rail voltage, the first mirror transistor having a first terminal coupled to the output and a second terminal coupled to the at least one rail voltage, the circuit comprising:
    a bias transistor directly connected to a first terminal of the second mirror transistor, the bias transistor having a terminal with a quiescent voltage that is substantially equal to the quiescent voltage of the output; and
    a diode connected transistor directly connected to a second terminal of the second mirror transistor and the at least one rail voltage.

2. The circuit as defined by claim 1 wherein the transistors are one of field effect transistors and bipolar junction transistors.

3. The circuit as defined by claim 1 wherein the transistors are at least one of NPN bipolar junction transistors and PNP bipolar junction transistors.

4. The circuit as defined by claim 1 wherein the first mirror transistor is an output transistor.

5. The circuit as defined by claim 1 wherein the terminal of the bias transistor is not coupled with the output.

6. The circuit as defined by claim 1 wherein the first and second mirror transistors are bipolar junction transistors, the bias transistor and diode connected transistor at least in part causing the first and second mirror transistors to have substantial equal collector-emitter quiescent voltages.

7. A circuit for matching a first mirror transistor with a second mirror transistor in a current mirror, the first mirror transistor being a diode connected transistor, the circuit comprising:
    a first bias transistor directly connected with a first terminal of the second mirror transistor; and
    a second bias transistor directly connected with a second terminal of the second mirror transistor, the second bias transistor being a diode connected transistor, the first bias transistor, second bias transistor, and second mirror transistor forming a voltage loop in which the sum of the voltages in the loop equals zero.

8. The circuit as defined by claim 7 wherein the transistors are one of field effect transistors and bipolar junction transistors.

9. The circuit as defined by claim 7 wherein the transistors are at least one of NPN bipolar junction transistors and PNP bipolar junction transistors.

10. The circuit as defined by claim 7 wherein the first and second mirror transistors are bipolar junction transistors, the first and second bias transistors at least in part causing the first and second mirror transistors to have substantially equal collector-emitter quiescent voltages.

11. The circuit as defined by claim 7 wherein the first bias transistor is coupled with the second bias transistor.

12. The circuit as defined by claim 7 wherein the first bias transistor has a base node, the second bias transistor also having a base node, the base nodes of the first and second bias transistors being coupled at the same potential.

13. An amplifier having at least one rail voltage and an output with a quiescent voltage, the amplifier comprising:

an output transistor having a first terminal coupled with the output and a second terminal coupled with the at least one rail voltage;

a first bias transistor, the first bias transistor forming a mirror with the output transistor;

a second bias transistor coupled to a first terminal of the first bias transistor, the second bias transistor having a terminal with a quiescent voltage that is substantially equal to the quiescent voltage of the output;

a third bias transistor coupled to a second terminal of the first bias transistor and the at least one rail voltage, the third bias transistor being a diode connected transistor;

a mirror transistor that forms a mirror with the third bias transistor; a fourth bias transistor coupled with a first terminal of the mirror transistor; and a fifth bias transistor coupled with a second terminal of the mirror transistor, the fifth bias transistor being a diode connected transistor, the fourth bias transistor, fifth bias transistor, and mirror transistor forming a voltage loop in which the stun of the voltages in the loop equals zero.

14. The amplifier as defined by claim 13 wherein the transistors are one of field effect transistors and bipolar junction transistors.

15. The amplifier as defined by claim 13 wherein the transistors are at least one of NPN bipolar junction transistors and PNP bipolar junction transistors.

16. The amplifier as defined by claim 13 wherein the second bias transistor has no terminal coupled with the output of the amplifier.

17. The amplifier as defined by claim 13 wherein the fourth bias transistor has a base node, the fifth bias transistor also having a base node, the base nodes of the fourth and fifth bias transistors being coupled at the same potential.

18. The amplifier as defined by claim 13 wherein the quiescent voltage of the output is zero volts.

19. The amplifier as defined by claim 13 wherein the output transistor is a portion of an A-B output stage.

20. The amplifier as defined by claim 13 wherein the second bias transistor is doped in an opposite manner to the doping of the first bias transistor.

* * * * *